US010056411B2

(12) United States Patent
Hao et al.

(10) Patent No.: US 10,056,411 B2
(45) Date of Patent: Aug. 21, 2018

(54) ARRAY SUBSTRATE, PREPARATION AND DRIVING METHOD THEREOF, LIQUID CRYSTAL DISPLAY PANEL AND DISPLAY DEVICE

(71) Applicant: BOE Technology Group Co., Ltd., Beijing (CN)

(72) Inventors: Guangye Hao, Beijing (CN); Teng Ye, Beijing (CN); Lijun Zhao, Beijing (CN); Yunsik Im, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 884 days.

(21) Appl. No.: 14/092,847

(22) Filed: Nov. 27, 2013

(65) Prior Publication Data

US 2014/0146264 A1 May 29, 2014

(30) Foreign Application Priority Data

Nov. 27, 2012 (CN) .......................... 2012 1 0491174

(51) Int. Cl.
*H01L 27/12* (2006.01)
*G02F 1/1343* (2006.01)
*G02F 1/1362* (2006.01)

(52) U.S. Cl.
CPC ...... *H01L 27/124* (2013.01); *G02F 1/134363* (2013.01); *G02F 1/136286* (2013.01)

(58) Field of Classification Search
CPC ............... H01L 27/24; G02F 1/134363; G02F 1/136286; G02F 1/1347; G02F 1/13452; G02F 2001/134318
See application file for complete search history.

(56) References Cited

U.S. PATENT DOCUMENTS

2006/0001815 A1* 1/2006 Kim .................. G02F 1/134363
349/141
2007/0153198 A1* 7/2007 Cho .................. G02F 1/134363
349/141
(Continued)

FOREIGN PATENT DOCUMENTS

CN         1991541 A        7/2007
CN       101308294 A    *  11/2008  ........... G02F 1/1343
(Continued)

OTHER PUBLICATIONS

First Office Action for corresponding Chinese Patent Application No. 201210491174.3, 5 pages, (dated Oct. 30, 2014).

Primary Examiner — Edward Glick
Assistant Examiner — Anthony G Quash
(74) Attorney, Agent, or Firm — Womble Bond Dickinson (US) LLP

(57) ABSTRACT

The present invention discloses an array substrate, preparation and driving methods thereof, a liquid crystal display panel and a display device, for reducing the drive voltage required by a liquid crystal display device, and increasing the light transmission rate. The array substrate comprises data lines and gate lines intersecting transversely and longitudinally to form a plurality of pixel units, each pixel unit comprising a pixel electrode and common electrodes, wherein the common electrodes include first common electrodes and second common electrodes; the first common electrodes, the second common electrodes and the pixel electrode are located in a same layer and do not overlap with each other; and the first common electrodes and the second common electrodes are in strip patterns, and the first common electrodes, the pixel electrode and the second common electrode are spaced apart from each other.

17 Claims, 7 Drawing Sheets

(56) References Cited

U.S. PATENT DOCUMENTS

| | | | | |
|---|---|---|---|---|
| 2008/0239178 A1* | 10/2008 | Nagai | ................ | G02F 1/133555 |
| | | | | 349/33 |
| 2008/0284967 A1* | 11/2008 | Oh | .................... | G02F 1/134363 |
| | | | | 349/144 |
| 2010/0265447 A1* | 10/2010 | Seo | ................... | G02F 1/134363 |
| | | | | 349/141 |
| 2012/0154368 A1* | 6/2012 | Sakurai | ............ | G02F 1/134363 |
| | | | | 345/212 |
| 2012/0300158 A1* | 11/2012 | Chae | .................... | G02F 1/1343 |
| | | | | 349/106 |

FOREIGN PATENT DOCUMENTS

| | | |
|---|---|---|
| CN | 101308294 A | 11/2008 |
| CN | 101661185 A | 3/2010 |
| KR | 20050118812 A | 12/2005 |
| KR | 20070049921 A | 5/2007 |

* cited by examiner

ARRAY SUBSTRATE, PREPARATION AND DRIVING METHOD THEREOF, LIQUID CRYSTAL DISPLAY PANEL AND DISPLAY DEVICE

FIELD OF THE INVENTION

The present invention relates to the field of liquid crystal display technology, and particularly, to an array substrate, preparation and driving methods thereof, a liquid crystal display panel and a display device.

BACKGROUND OF THE INVENTION

Thin Film Transistor Liquid Crystal Displays (TFT-LCDs) occupy a major share in the market of display device due to low cost, high yield and good display effect. Among them, in-plane switching (IPS) mode liquid crystal di-play devices have become one of the main-stream liquid crystal display devices at present due to wide viewing angle.

An existing IPS mode liquid crystal display device comprises a liquid crystal display panel, which comprises an array substrate and a color film substrate; liquid crystal molecules are filled between the array substrate and the color film substrate, the array substrate comprises data lines and gate lines intersecting transversely and longitudinally to form a plurality of pixel units; each pixel unit comprises a pixel electrode and common electrodes, the pixel electrode and the common electrodes are parallel to each other and generate a planar electric field; the crystal liquid molecules can be driven to rotate through the planar electric field generated between the pixel electrode and the common electrodes in each pixel unit to display an image. In spite of the wide viewing angle and good display effect, the IPS mode liquid crystal display device with the above structure also has the disadvantages of high required drive voltage and low light transmission rate (resulting from marginal electric field effect).

SUMMARY OF THE INVENTION

Embodiments of the present invention provide an array substrate and preparation and driving methods thereof, a liquid crystal display panel and a display device, for reducing the drive voltage required by the existing IPS mode liquid crystal display device, and increasing the light transmission rate.

An embodiment of the present invention provides an array substrate, which comprises data lines and gate lines intersecting transversely and longitudinally to form a plurality of pixel units, each pixel unit comprising a pixel electrode and common electrodes, wherein, the common electrodes include first common electrodes and second common electrodes, the first common electrodes, the second common electrodes and the pixel electrode are located in a same layer and do not overlap with each other, the first common electrodes and the second common electrodes are in strip patterns, and the first common electrodes, the pixel electrode and the second common electrodes are spaced apart from each other.

An embodiment of the present invention also provides a preparation method of an array substrate, the array substrate comprises data lines and gate lines intersecting transversely and longitudinally to define a plurality of pixel units, each pixel unit comprising a pixel electrode and common electrodes, wherein the common electrodes include first common electrodes and second common electrodes; the first common electrodes, the second common electrodes and the pixel electrode are located in a same layer and do not overlap with each other; the first common electrodes and the second common electrodes are in strip patterns; the first common electrodes, the pixel electrode and the second common electrodes are spaced apart from each other, and the array substrate further comprises a first common electrode wire and a second common electrode wire, and the first common electrode wire and the second common electrode wire are parallel to the gate lines; and the method comprises:

A. depositing a gate metal film on a glass substrate, etching the gate metal film to form a pattern including the gate lines, the first common electrode wire and the second common electrode wire through a patterning process;

B. forming a gate insulation layer, an active layer and a doped layer on the glass substrate subjected to the processing in the step A, and etching to form a pattern of a silicon island through a patterning process;

C. depositing a source-drain metal layer on the glass substrate subjected to the processing in the step B, and etching the doped layer and the source-drain metal layer to form a pattern including a source-drain metal electrode and the data lines through a patterning process;

D. depositing a passivation layer on the glass substrate subjected to the processing in the step C, and etching to form a pattern of first contact vias, a pattern of second contact vias and a pattern of a third contact via, respectively, through a patterning process; and E. forming a transparent metal layer on the glass substrate subjected to the processing in the step D, and etching to form a pattern including the pixel electrode, the first common electrodes and the second common electrodes through a patterning process, connecting the pixel electrode to the source-drain metal electrode through the third contact via, connecting the first common electrodes to the first common electrode wire through the first contact via, and connecting the second common electrodes to the second common electrode wire through the second contact vias.

An embodiment of the present invention also provides a liquid crystal display panel, comprising a color film substrate and the above array substrate which are aligned to form a cell with liquid crystals filled therebetween.

An embodiment of the present invention also provides a liquid crystal display device comprising the above liquid crystal display panel.

An embodiment of the present invention also provides a driving method of the above array substrate, comprising:

supplying a first voltage to the first common electrodes;

supplying a second voltage to the pixel electrode, and the voltage difference between the first voltage and the second voltage being a first preset value: and supplying a third voltage to the second common electrodes, the voltage difference between the first voltage and the third voltage being a second preset value, and the voltage difference between the second voltage and the third voltage being a third preset value.

Other features and advantages of the present invention will be discussed in the subsequent description, and partially become obvious from the description or are understood through implementing the present invention. Objectives and other advantages of the present invention can be achieved or obtained through the structure specifically set forth in the written description, claims and accompanying drawings.

BRIEF DESCRIPTION OF THE BRA WINGS

The drawings described herein are intended for further understanding of the invention and form part of the present invention, and the exemplary embodiments of the invention and description thereof are used for illustrating the present invention instead of improperly limiting the present invention. In the drawings.

Figure 1:
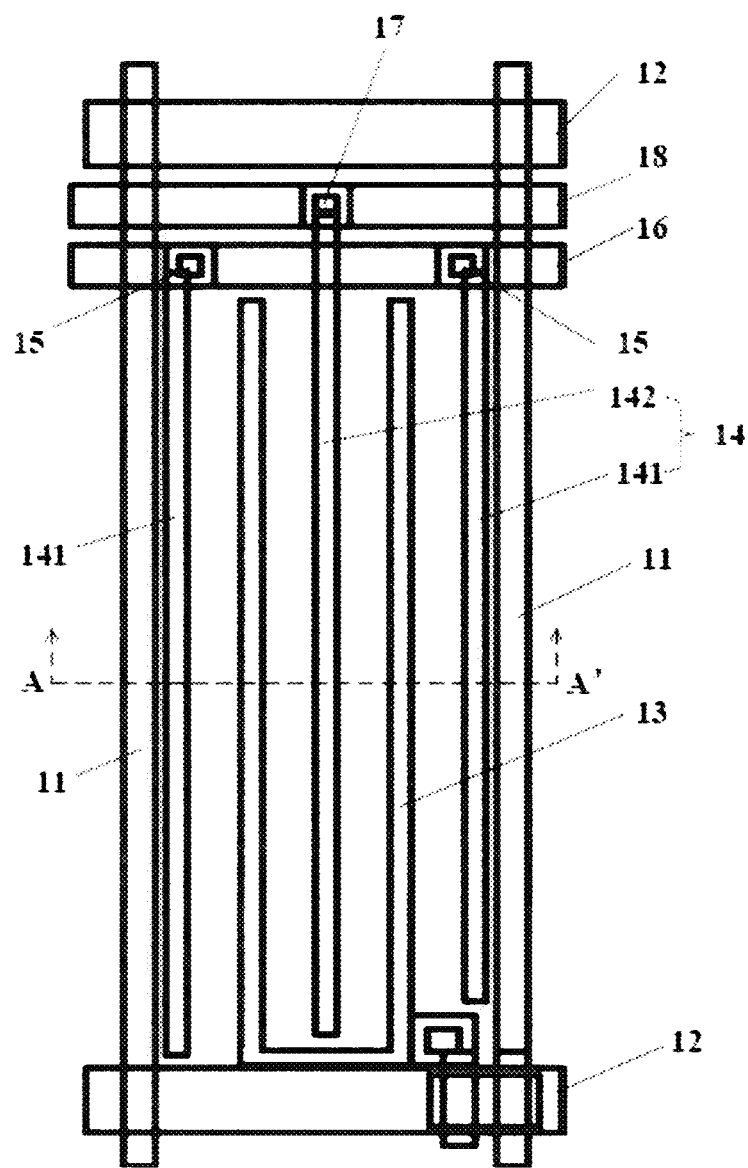
FIG. 1 is a structural schematic diagram of an array substrate in an embodiment of the present invention.
Figure 6A:
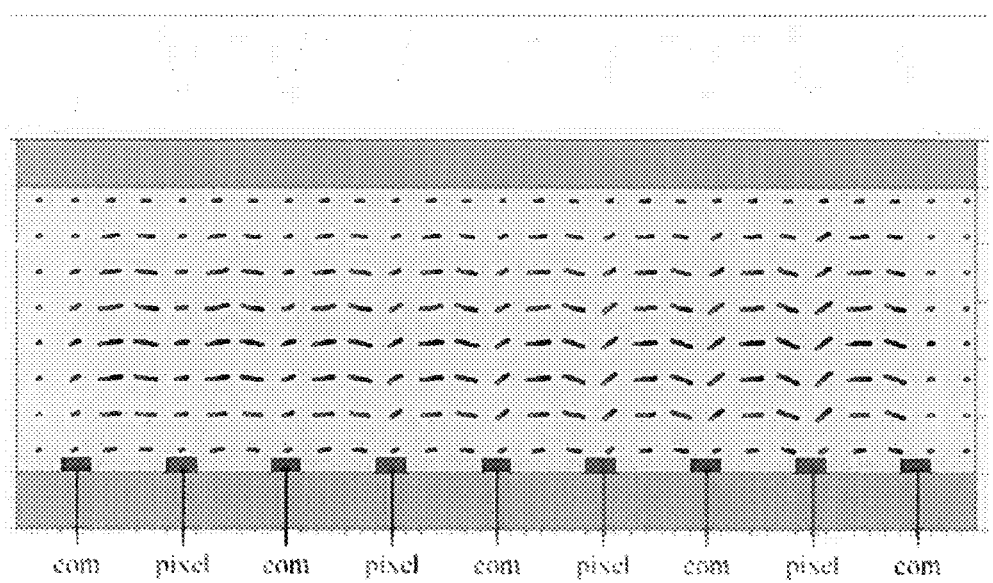
Figure 6B:
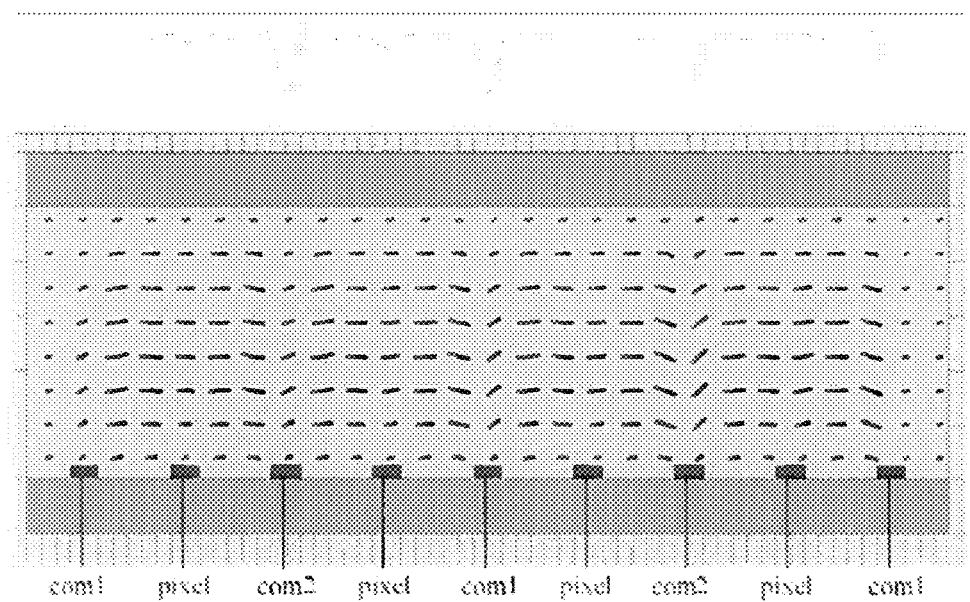
Figure 7:
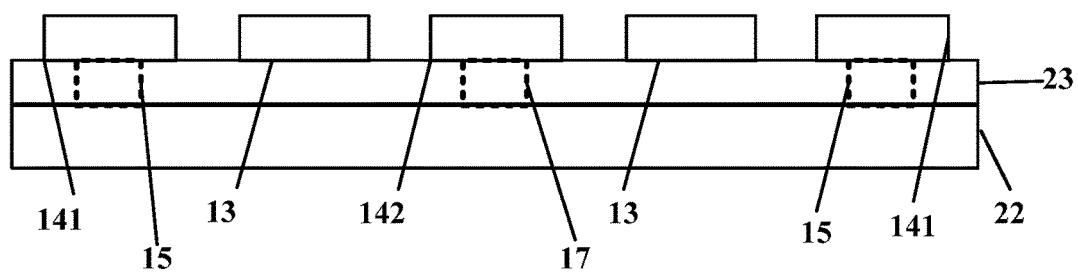

FIGS. 5*a*-5*e* are schematic diagrams illustrating process flow of a preparation method of an array substrate in an embodiment of the present invention;

FIG. 6*a* is a schematic diagram of liquid crystal director and light transmission rate simulations of an IPS mode liquid crystal display device in the prior art;

FIG. 6*b* is a schematic diagram of liquid crystal director and light transmission rate simulations of a liquid crystal display device in an embodiment of the present invention-; and FIG. 7 is a detailed structural schematic diagram of a transverse section at AA' in FIG. 1.

DETAILED DESCRIPTION OF THE EMBODIMENT

To reduce the drive voltage required by a liquid crystal display device and increase the light transmission rate of the liquid crystal display device, embodiments of the present invention provide an array substrate, preparation and driving methods thereof, a liquid crystal display panel and a display device.

Preferred embodiments of the present invention are described below in conjunction with the accompanying drawings, and it should be understood that the preferred embodiments described herein are only used for describing and illustrating the present invention instead of limiting the present invention, and the embodiments and the features in these embodiments in the present invention can be combined with each other in a condition that no conflict will be caused.

As shown in FIG. 1, which is a structural schematic diagram of an array substrate provided in an embodiment of the present invention, the array substrate comprises data lines 11 and gate lines 12 intersecting transversely and longitudinally to form a plurality of pixel units, each pixel unit comprising a pixel electrode 13 and common (com) electrodes 14, wherein the common electrodes 14 include first common electrodes 141 and a second common electrode 142. the first common electrodes 141, the second common electrode 142 and the pixel electrode 13 are located in a same layer and do not overlap with each other, the first common electrodes 141 and the second common electrode 142 are in strip patterns, the pixel electrode 13 is in a concave pattern, and the first common electrodes 141, the pixel electrode 13 and the second common electrode 142 are spaced apart from each other.

For example, the second common electrode 142 is arranged between two lateral sides of the pixel electrode 13, and first common electrodes 141 are respectively arranged outside the two lateral sides of the pixel electrode 13, that is, in a same pixel unit, the first common electrodes 141, the pixel electrode 13 and the second common electrode 142 are arranged in a sequence of one of the first common electrodes 141, one lateral side of the pixel electrode 13, the second common electrode 142, the other lateral side of the pixel electrode 13 and another first common electrode 141;

alternatively, the first common electrode 141 is arranged between the two lateral sides of the pixel electrode 13, and the second common electrodes 142 are respectively arranged outside the two lateral sides of the pixel electrode 13, that is, in a same pixel unit, the first common electrode 141, the pixel electrode 13 and the second common electrodes 142 are arranged in a sequence of one of the second common electrodes 142, one lateral side of the pixel electrode 13, the first common electrode 141, the other lateral side of the pixel electrode 13 and another second common electrode 142;

alternatively, the first common electrode 141 and the second common electrode 142 are arranged respectively outside the two lateral sides of the pixel electrode 13, that is, in a same pixel unit, the first common electrode 141, the pixel electrode 13 and the second common electrode 142 are arranged in a sequence of the first common electrode 141, the pixel electrode 13 and the second common electrode 142, or the second common electrode 142, the pixel electrode 13 and the first common electrode 141;

alternatively, both the first common electrode 141 and the second common electrode 142 are arranged at a same side of the pixel electrode 13, that is, in a same pixel unit, the first common electrode 141, the pixel electrode 13 and the second common electrode 142 are arranged in a sequence of the first common electrode 141, the second common electrode 142 and the pixel electrode 13; or the second common electrode 142, the first common electrode 141 and the pixel electrode 13; or the pixel electrode 13, the first common electrode 141 and the second common electrode 142; or the pixel electrode 13, the second common electrode 142 and the first common electrode 141.

Of course, the pixel electrode 13 can also be in other patterns, such as a strip pattern or a plate pattern.

Preferably, the first common electrodes 141 and the second common electrode are parallel to the data lines 11.

Figure 2:
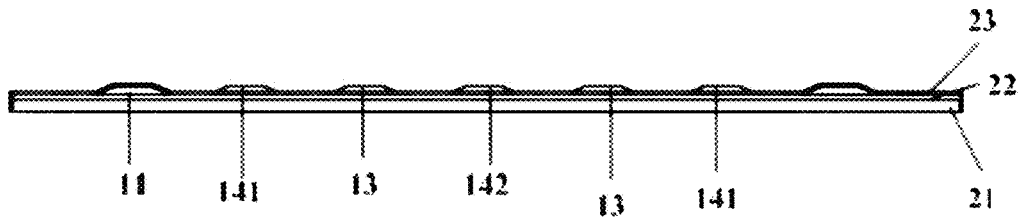
FIG. 2 is a structural schematic diagram of a transverse section at AA' in FIG. 1.

As shown in FIG. 2 and in FIG. 7, which are a schematic diagram and a detailed schematic diagram, respectively, of a transverse section at AA' of the array substrate shown in FIG. 1, the array substrate also comprises a glass substrate 21, a gate insulation layer 22 (GI) and a passivation layer 23 (PVX), and the data lines 11 are arranged on the gate insulation layer 22.

As shown in FIGS. 1, 2, and 7 depending on the respective view(s), the array substrate further comprises a first common electrode wire 16 and a second common electrode wire 18, and the first common electrodes 141, the second common electrode 142 and the pixel electrode 13, and the first common electrode wire 16 and the second common electrode wire 18 are arranged at the upper side and the lower side of the passivation layer 23, respectively; first contact vias 15 are formed at positions where the passivation layer 23 overlaps with the first common electrodes 141 and the first common electrode wire 16, and a second contact via 17 is formed at a position where the passivation layer 23 overlaps with the second common electrode 142 and the second common electrode wire 18, the first common electrodes 141 are connected to the first common electrode wire 16 through the first contact vias 15, the second common electrode 142 is connected to the second common electrode wire 18 through the second contact via 17; and the first common electrode wire 16 and the second common electrode wire 18 are parallel to the gate lines 12.

Figure 3:
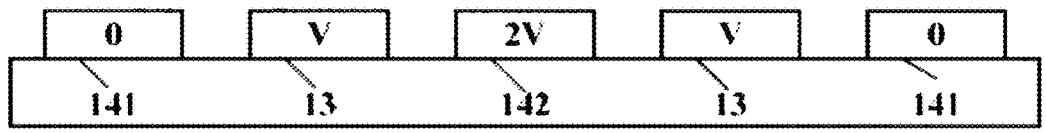
FIG. 3 is a schematic diagram of positions and voltage distribution of a pixel electrode and common electrodes in an embodiment of the present invention.

In specific implementation, a certain voltage difference, such as a first preset value, exists between the voltages applied to the first common electrodes 141 and the pixel electrode 13; a certain voltage difference, such as a second preset value exists between the voltages applied to pixel electrode 13 and the second common electrode 142; and a certain voltage difference, such as a third preset value, also exists between the voltages applied to the first common electrodes 141 and the second common electrode 142. The specific values of the first preset value, the second preset value and the third preset value can be determined by those skilled in the art according to actual needs. Preferably, at least two preset values among the first preset value, the second preset value and the third preset value are not zero. Thus, at least two electric fields can be formed in a same pixel unit. More preferably, none of the first preset value, the second preset value and the third preset value is zero; or to say, the voltages applied to the first common electrodes 141, the second common electrode 142 and the pixel electrode 13 are different from each other. Thus, three electric fields in total, including an electric field between the first common electrodes and the second common electrode, an electric field between the first common electrodes and the pixel electrode, and an electric field between the second common electrode and the pixel electrode, can be formed in each pixel unit. Preferably, a possible schematic diagram of positions and voltage distribution of a pixel electrode and common electrodes in an embodiment of the present invention is shown in FIG. 3. In FIG. 3 the voltage applied to the first common electrodes 141 is the same as the voltage of a common electrode in a traditional liquid crystal display device, for example it can be 0; the voltage applied to the second common electrode 142 can be but not limited to twice the voltage applied to the pixel electrode 13, for example, if the voltage applied to the pixel electrode 13 is 5V, the voltage applied to the second electrode 142 can be 10V, or if the voltage applied to the pixel electrode 13 is −5V, the voltage applied to the second electrode 142 can be −10V.

Preferably, in specific implementation, material of the first common electrode wire 16 and the second common electrode wire 18 can be but not limited to a metal or an alloy, and more preferably, the material of the first common electrode wire 16 and the second common electrode wire 18 can be a metal chosen from or an ally formed by at least two of Mo, Al, Nb, Ti and the like.

In specific implementation. material of the first common electrodes 141 and the second common electrode 142 can be but not limited to be a transparent material, and more preferably, the transparent material can use ITO (indium Tin Oxide), IZO (indium Zinc Oxide) or the like.

In specific implementation, material of the pixel electrode 13 can be the same as that of the first common electrodes 141 and the second common electrode 142, that is, the material of the pixel electrode 13 can be ITO (Indium Tin Oxide). IZO (Indium Zinc Oxide) or the like.

Based on the same inventive concept, embodiments of the present invention also provide a liquid crystal display panel and a liquid crystal display device.

In specific implementation, the above array substrate can be arranged in a liquid crystal display panel, wherein, the liquid crystal display panel comprises a color film substrate and the above array substrate, and liquid crystal molecules are filled between the color film substrate and the array substrate.

It should be noted that, the above liquid crystal display panel can be arranged in a liquid crystal display device, and especially applies to an IPS liquid crystal display device, that is, the liquid crystal display device described in this embodiment is an improved IPS liquid crystal display device.

In the above array substrate, the common electrodes are divided into the first common electrodes and the second common electrode, the first common electrodes, the pixel electrode and the second common electrode are located in the same layer and spaced apart from each other; when certain voltage differences exist between every two of the first common electrodes, the pixel electrode and the second common electrode, three electric fields in total, including an electric field formed between the first common electrodes and the pixel electrode, an electric field formed between the second common electrode and the pixel electrode, and an electric field formed between the first common electrodes and the second common electrode, exist in electric field of each pixel unit, and the three electric fields are superimposed together, thus being more favorable for rotating liquid crystal molecules, while in an existing IPS mode liquid crystal display device, only one electric field exists in each pixel unit, so if liquid crystal molecules of the existing IPS mode liquid crystal display device and the liquid crystal display device described in the embodiment are required to make the same rotation, the drive voltage required by the existing IPS mode liquid crystal display device is higher, but the light transmission rate of the existing IPS mode liquid crystal display device is lower, and therefore, the liquid crystal display device described in the embodiment can effectively reduce the drive voltage required by the existing IPS mode liquid crystal display device, and increase the light transmission rate of the existing IPS mode liquid crystal display device.

Based on the same inventive concept, embodiments of the present invention also provide preparation and driving methods of the above array substrate. As the problem-solving principle of the liquid crystal panel and the liquid crystal display device is similar to that of the array substrate, the implementations of the liquid crystal panel and the liquid crystal display device can be performed with reference to the implementation of the preparation and driving methods of the array substrate, and are not repeated herein.

Figure 4:
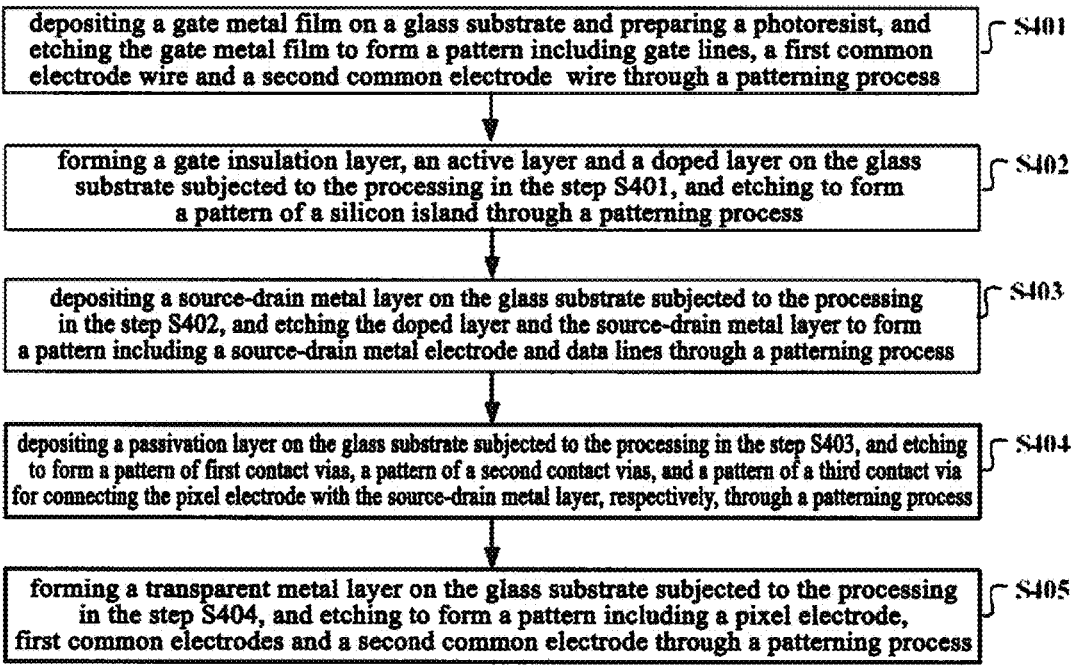
FIG. 4 is a flow chart of implementing a preparation method of an array substrate in an embodiment of the present invention.
Figure 5A:
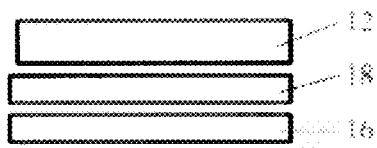
Figure 5A:

In specific implementation, in an embodiment of the present invention, the above array substrate can be prepared by using a traditional 5 mask process, as shown in FIG. 4. which is flow chart of implementing a preparation method of the array substrate in the embodiment of the present invention, and the method can include the following steps:

S401. depositing a gate metal film on a glass substrate and preparing a photoresist, and etching the gate metal film to form a pattern including gate lines 12, a first common electrode wire 16 and a second common electrode wire 18 through a patterning process;

In specific implementation, structure of the glass substrate subjected to the processing in the step S401 is schematically shown in FIG. 5a.

S402. forming a gate insulation layer, an active layer and a doped layer on the glass substrate subjected to the processing in the step S401 and preparing a photoresist, and etching to form a pattern of a silicon island 19 through a patterning process.

Figure 5B:
Figure 5B:
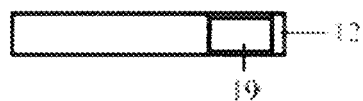

In specific implementation, structure of the glass substrate subjected to the processing in the step S402 is schematically shown in FIG. 5b.

Figure 5C:
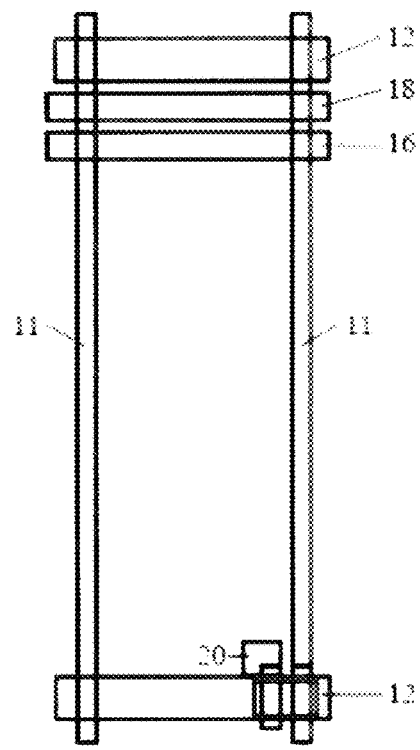

S403. depositing a source-drain metal layer on the glass substrate subjected to the processing in the step S402 and preparing a photoresist, and etching the doped layer and the source-drain metal layer to form a pattern including a source-drain metal electrode 20 and data lines 11 through a patterning process;

In specific implementation, structure of the glass substrate subjected to the processing in the step S403 is schematically shown in FIG. 5*c*.

Figure 5D:
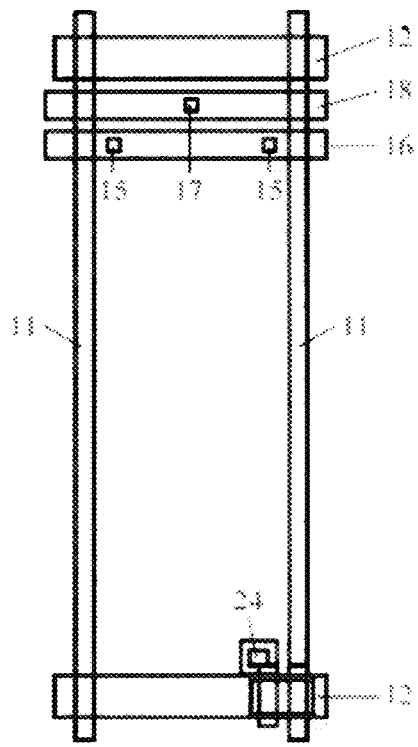

S404. depositing a passivation layer on the glass substrate subjected to the processing in the step S403 and preparing a photoresist, and etching to form patterns of first contact vias 15, a pattern of a second contact via 17 and a pattern of a third contact via 24, respectively, through a patterning process;

In specific implementation, structure of the glass substrate subjected to the processing in the step S404 is schematically shown in FIG. 5*d*.

S405. forming a transparent metal layer on the glass substrate subjected to the processing in the step S404 and preparing a photoresist, and etching to form a pattern including a pixel electrode 13, first common electrodes 141 and a second common electrode 142 through a patterning process, connecting the pixel electrode 13 with the source-drain metal electrode 20 through the third contact via 24, connecting the first common electrodes 141 to the first common electrode wire 16 through the first contact vias 15, and connecting the second common electrode 142 to the second common electrode wire 18 through the second contact via 17.

Figure 5E:
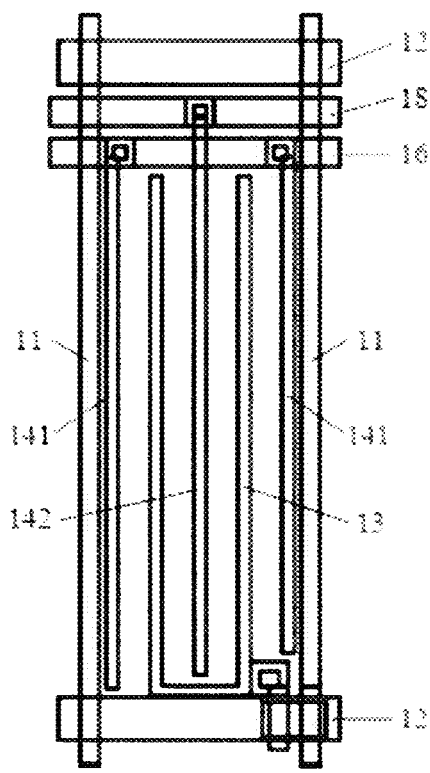

In specific implementation, structure of the glass substrate subjected to the processing in the step S405 is schematically shown in FIG. 5*e*.

Preferably, material of the first common electrode wire 16 and the second common electrode wire 18 can be but not limited to a metal or an alloy, and more preferably, the material of the first common electrode wire 16 and the second common electrode wire 18 can be an metal chosen from or an alloy formed by at least two of Mo, Al, Nb, Ti and the like.

In specific implementation, material of the first common electrodes 141 and the second common electrode 142 can be but not limited to a transparent material, and more preferably, the transparent material can be ITO (Indium Tin Oxide), IZO (Indium Zinc Oxide) or the like.

In specific implementation, material of the pixel electrode 13 can be the same as the first common electrodes 141 and the second common electrode 142, that is, the material of the pixel electrode 13 can be ITO (Indium Tin Oxide), IZO (Indium Zinc Oxide) or the like.

An embodiment of the present invention also provides a driving method of the above array substrate, which comprises:

supplying a first voltage to the first common electrodes:

supplying a second voltage to the pixel electrode, and the voltage difference between the first voltage and the second voltage being a first preset value; and supplying a third voltage to the second common electrode, the voltage difference between the first voltage and the third voltage being a second preset value, and the voltage difference between the second voltage and the third voltage being a third preset value.

Preferably, at least two preset values among the first preset value, the second preset value and the third preset value are not zero. More preferably, at least two values among the first preset value, the second preset value and the third preset value are not the same.

Preferably, the voltage applied to the first common electrodes is zero; and the voltage applied to the second common electrode is twice the voltage applied to the pixel electrode.

As shown in FIGS. 6*a* and 6*b*, which are schematic diagrams of liquid crystal director and light transmission rate simulations of the IPS mode liquid crystal display device in the prior art and the liquid crystal display device in the embodiment of the present invention, respectively. In FIG. 6*a*, "pixel" represents a pixel electrode, and "com" represents a common electrode, while in FIG. 6*b*, "pixel" represents a pixel electrode, "com 1" represents a first common electrode, and "com 2" represents a second common electrode. It can be seen from FIG. 6*a* that for the existing IPS mode liquid crystal display device, when the voltage of the pixel electrode is 5V, its light transmission rate is 32.01%. and it can be seen from FIG. 6*b* that for the liquid crystal display device provided in the embodiment of the present invention, when the voltage of the pixel electrode is 4.5V, its light transmission rate is 33.73%. It is thus clear that by dividing the common electrodes into the first common electrodes and the second common electrode, as three electric fields in total, including the electric field between the first common electrodes and the pixel electrode, the electric field between the second common electrode and the pixel electrode, and the electric field between the first common electrodes and the second common electrode, exist in each pixel unit, and superimposition of the three electric fields reduces the drive voltage required by the liquid crystal display device, and increases the light transmission rate of the liquid crystal display device.

The preferred embodiments of the present invention has been described, however, additional variations and modifications can be made to these embodiments by those skilled in the art, once they learn the basic inventive concept. Therefore, the appended claims are intended to be interpreted as including the preferred embodiments and all variations and modifications falling into the scope of the present invention.

Apparently, various changes and variations can be made to the present invention by those skilled in the art without departing from the spirit and scope of the present invention. Thus, if these changes and variations are within the scope of the claims of the present invention and equivalent technologies thereof, the present invention is also intended to include these changes and variations.

What is claimed is:

1. An array substrate, comprising data lines and gate lines intersecting transversely and longitudinally to form a plurality of pixel units, each pixel unit comprising a pixel electrode and common electrodes, wherein the common electrodes include first common electrodes and a second common electrode; the first common electrodes, the second common electrode and the pixel electrode are located in a same layer and do not overlap with each other; and the first common electrodes and the second common electrode are in strip patterns, and the first common electrodes, the pixel electrode and the second common electrode are spaced apart from each other; and wherein the first common electrodes are insulated from the second common electrode, and the first common electrodes and the second common electrode are configured to provide a voltage difference between voltages applied to the first common electrodes and the pixel electrode as a first preset value, provide a voltage difference between voltages applied to the pixel electrode and the second common electrode as a second preset value, and provide a voltage difference between voltages applied to the first common electrodes and the second common electrode as a third preset value; and wherein none of the first preset value, the second preset value and the third preset value is zero to form three electric fields in each pixel unit.

2. The array substrate of claim 1, wherein the pixel electrode is in a U-shaped pattern;
the second common electrode is arranged between two lateral sides of the pixel electrode, and the first common electrodes are respectively arranged outside the two lateral sides of the pixel electrode;
or, the first common electrode is arranged between the two lateral sides of the pixel electrode, and the second common electrodes are respectively arranged outside the two lateral sides of the pixel electrode;
or, the first common electrode and the second common electrode are respectively arranged outside the two lateral sides of the pixel electrode;
or, the first common electrode and the second common electrode are both arranged at a same side of the pixel electrode.

3. The array substrate of claim 1, wherein the pixel electrode is a strip electrode or a plate electrode.

4. The array substrate of claim 1, wherein the array substrate also comprises a passivation layer, a first common electrode wire and a second common electrode wire; the first common electrode wire and the second common electrode wire are parallel to the gate lines;
the first common electrodes, the second common electrodes and the pixel electrode, and the first common electrode wire and the second common electrode wire are arranged at upper side and lower side of the passivation layer, respectively;
first contact vias are formed at positions where the passivation layer overlaps with the first common electrodes and the first common electrode wire, and second contact vias are formed at positions where the passivation layer overlaps with the second common electrode and the second common electrode wire; and the first common electrodes are connected to the first common electrode wire through the first contact vias, and the second common electrodes are connected to the second common electrode wire through the second contact vias.

5. The array substrate of claim 4, wherein a material of the first common electrode wire and the second common electrode wire is a metal or an alloy.

6. The array substrate of claim 5, wherein the metal includes Mo, Al, Nb and Ti; and the alloy includes an alloy formed by at least two metals of Mo, Al, Mb and Ti.

7. The array substrate of claim 1, wherein the voltage applied to the first common electrodes is zero, and the voltage applied to the second common electrode is twice the voltage applied to the pixel electrode; or the voltage applied to the second common electrode is zero, and the voltage applied to the first common electrodes is twice the voltage applied to the pixel electrode.

8. The array substrate of claim 1, wherein a material of the first common electrodes and the second common electrodes is a transparent material.

9. The array substrate of claim 8, wherein the transparent material includes Indium Tin Oxide or Indium Zinc Oxide.

10. A liquid crystal display panel, comprising a color film substrate and an array substrate, wherein the color film substrate and the array substrate are aligned to form a cell with liquid crystals filled therebetween, the array substrate comprising data lines and gate lines intersecting transversely and longitudinally to form a plurality of pixel units, each pixel unit comprising a pixel electrode and common electrodes, wherein
the common electrodes include first common electrodes and a second common electrode; the first common electrodes, the second common electrode and the pixel electrode are located in a same layer and do not overlap with each other; and the first common electrodes and the second common electrodes are in strip patterns, and the first common electrodes, the pixel electrode and the second common electrode are spaced apart from each other; and
wherein the first common electrodes are insulated from the second common electrode, and the first common electrodes and the second common electrode are configured to provide a voltage difference between voltages applied to the first common electrodes and the pixel electrode as a first preset value, provide a voltage difference between voltages applied to pixel electrode and the second common electrode as a second preset value, and provide a voltage difference between voltages applied to the first common electrodes and the second common electrode as a third preset value; wherein none of the first preset value, the second preset value and the third preset value is zero to form three electric fields in each pixel unit.

11. The liquid crystal display panel of claim 10, wherein the pixel electrode is in a U-shaped pattern; the second common electrode is arranged between two lateral sides of the pixel electrode, and the first common electrodes are respectively arranged outside the two lateral sides of the pixel electrode; or, the first common electrode is arranged between the two lateral sides of the pixel electrode, and the second common electrodes are respectively arranged outside the two lateral sides of the pixel electrode; or, the first common electrode and the second common electrode are respectively arranged outside the two lateral sides of the pixel electrode; or, the first common electrode and the second common electrode are both arranged at a same side of the pixel electrode.

12. The liquid crystal display panel of claim 10, wherein the array substrate also comprises a passivation layer, a first common electrode wire and a second common electrode wire; the first common electrode wire and the second common electrode wire are parallel to the gate lines; the first common electrodes, the second common electrodes and the pixel electrode, and the first common electrode wire and the second common electrode wire are arranged at upper side and lower side of the passivation layer, respectively; first contact vias are formed at positions where the passivation layer overlaps with the first common electrodes and the first common electrode wire, and a second contact via is formed at a position where the passivation layer overlaps with the second common electrode and the second common electrode wire; and the first common electrodes are connected to the first common electrode wire through the first contact vias, and the second common electrode is connected to the second common electrode wire through the second contact via.

13. A liquid crystal display device, comprising a liquid crystal display panel, comprising a color film substrate and an array substrate, wherein the color film substrate and the array substrate are aligned to form a cell with liquid crystals filled therebetween, the array substrate comprising data lines and gate lines intersecting transversely and longitudinally to form a plurality of pixel units, each pixel unit comprising a pixel electrode and common electrodes, wherein the common electrodes include first common electrodes and a second common electrode; the first common electrodes, the second common electrode and the pixel electrode are located in a same layer and do not overlap with each other; and the first common electrodes and the second common electrode are in strip patterns, and the first common electrodes, the pixel electrode and the second common electrode are spaced apart from each other; and wherein the first common electrodes are insulated from the second common electrode, and the first common electrodes and the second common electrode are configured to provide a voltage difference between voltages applied to the first common electrodes and the pixel electrode as a first preset value, provide a voltage difference between voltages applied to the pixel electrode and the second common electrode as a second preset value, and provide a voltage difference between voltages applied to the first common electrodes and the second common electrode as a third preset value; wherein none of the first preset value, the second preset value and the third preset value is zero to form three electric fields in each pixel unit.

14. The array substrate of claim 1, wherein a driving method of the array substrate comprising:

supplying a first voltage to the first common electrodes;

supplying a second voltage to the pixel electrode, and a voltage difference between the first voltage and the second voltage being a first preset value: and supplying a third voltage to the second common electrodes, a voltage difference between the first voltage and the third voltage being a second preset value, and a voltage difference between the second voltage and the third voltage being a third preset value.

15. The array substrate of claim 14, wherein at least two preset values among the first preset value, the second preset value and the third preset value are not zero.

16. The array substrate of claim 15, wherein at least two values of the first preset value, the second preset value and the third preset value are different.

17. The array substrate of claim 14, wherein the voltage applied to the first common electrodes is zero; and the voltage applied to the second common electrode is twice the voltage applied to the pixel electrode.

* * * * *